(12) United States Patent
Inoue et al.

(10) Patent No.: US 7,709,780 B2
(45) Date of Patent: May 4, 2010

(54) PHOTOELECTRIC CONVERSION DEVICE AND CAMERA USING PHOTOELECTRIC CONVERSION DEVICE

(75) Inventors: Shunsuke Inoue, Kanagawa (JP);
Hiroshi Yuzurihara, Kanagawa (JP);
Tetsuya Itano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/111,342

(22) Filed: Apr. 29, 2008

(65) Prior Publication Data

US 2008/0230685 A1      Sep. 25, 2008

Related U.S. Application Data

(62) Division of application No. 11/527,485, filed on Sep. 27, 2006, now Pat. No. 7,385,172, which is a division of application No. 10/747,369, filed on Dec. 30, 2003, now Pat. No. 7,126,102.

(30) Foreign Application Priority Data

Jan. 6, 2003    (JP)    ............... 2003-000390
Sep. 11, 2003   (JP)    ............... 2003-319911

(51) Int. Cl.
*H01L 31/00* (2006.01)

(52) U.S. Cl. ............... 250/214.1; 250/214 R; 250/206.1; 257/290; 438/57; 438/60

(58) Field of Classification Search ............... 250/214.1, 250/208.1, 214 R; 257/290–292, 462–464; 438/57, 60

See application file for complete search history.

(56) References Cited

U.S. PATENT DOCUMENTS 6,166,405 A    12/2000   Kuriyama et al. ............ 257/290
6,391,767 B1    5/2002   Huster et al. ................ 438/630

(Continued)

FOREIGN PATENT DOCUMENTS

JP    63-044761 A    2/1988

(Continued)

*Primary Examiner*—Seung C Sohn
(74) *Attorney, Agent, or Firm*—Fitzpatrick, Cella, Harper & Scinto (57) ABSTRACT

A photoelectric conversion device is configured to include a light receiving region, for converting light to signal charges, and transistors. An insulation film is arranged on a surface of the light receiving region and under gate electrodes of the transistors. A first reflection prevention film of a refractive index higher than that of the insulation film is arranged at least above the light receiving region, to sandwich the insulation film between the first reflection prevention film and the light receiving region, and includes a silicon nitride film. An interlayer insulation film is arranged on the first reflection prevention film, and a second reflection prevention film is laminated between the first reflection prevention film and the interlayer insulation film. At least one of side walls of the gate electrodes of the transistors includes the silicon nitride film and a silicon oxide film arranged between the silicon nitride film and the gate electrodes. A transistor having a gate electrode with such a side wall includes a source or drain region of an LDD structure, in which a heavily doped region of the source or drain region of the LDD structure is self aligned to the side wall formed from the silicon nitride film and the silicon oxide film.

10 Claims, 10 Drawing Sheets

U.S. PATENT DOCUMENTS

| | | | |
|---|---|---|---|
| 6,507,059 B2 | 1/2003 | Chen et al. | 257/290 |
| 6,635,912 B2 | 10/2003 | Ohkubo | 257/292 |
| 6,894,268 B2 * | 5/2005 | Ohkawa | 250/214.1 |
| 7,126,102 B2 * | 10/2006 | Inoue et al. | 250/214 R |
| 7,385,172 B2 * | 6/2008 | Inoue et al. | 250/214 R |
| 2002/0048840 A1 | 4/2002 | Tanigawa | 438/65 |
| 2004/0080009 A1 | 4/2004 | Sandhu et al. | 257/437 |

FOREIGN PATENT DOCUMENTS

| | | |
|---|---|---|
| JP | 11-233750 A | 8/1999 |
| JP | 2000-012822 A | 1/2000 |
| JP | 2001-111022 A | 4/2001 |
| JP | 2001-291857 A | 10/2001 |
| JP | 2002-083949 A | 3/2002 |

* cited by examiner

PHOTOELECTRIC CONVERSION DEVICE AND CAMERA USING PHOTOELECTRIC CONVERSION DEVICE

CROSS-REFERENCE TO RELATED APPLICATIONS

This application is a divisional of U.S. patent application Ser. No. 11/527,485, filed Sep. 27, 2006, which is a divisional of U.S. patent application Ser. No. 10/747,369, filed Dec. 30, 2003, and claims benefit of the filing dates of these earlier applications. This application also claims priority benefit of the filing dates of Japanese Patent Applications Nos. 2003-000390 and 2003-319911, filed Jan. 6, 2003, and Sep. 11, 2003, respectively. The entire disclosure of each of the above applications is incorporated herein by reference.

BACKGROUND OF THE INVENTION

1. Field of the Invention

The present invention relates to a solid state image pickup device, more particularly to a metal oxide semiconductor (MOS) type solid state image pickup device and a method for manufacturing the same.

2. Description of Related Art

Recently, demand for a photoelectric conversion device has rapidly increased as an image pickup device of a two-dimensional image input device of a digital still camera and a video cam recorder primarily, or as a one-dimensional image reading device of a facsimile and a scanner primarily.

Figure 14:
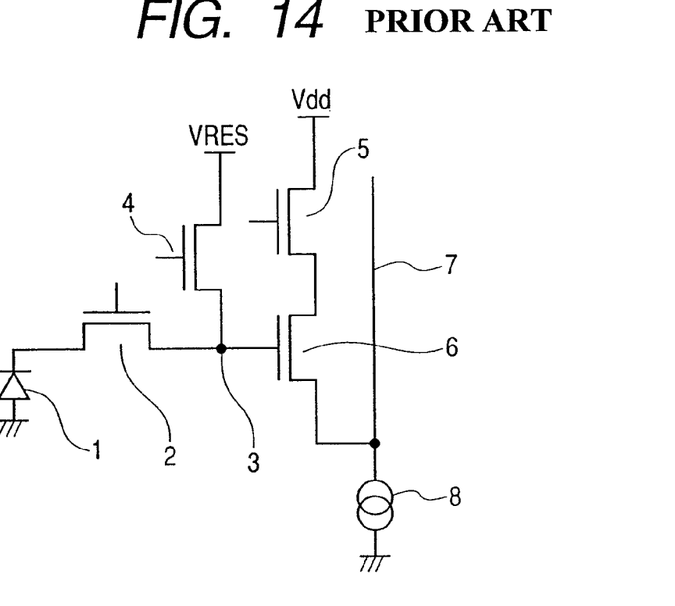
FIG. 14 is a general circuit configuration diagram of a pixel carrying a CMOS sensor.

A charge-coupled device (CCD) and a MOS type sensor are used as the photoelectric conversion devices for these uses. A complementary metal oxide semiconductor (CMOS) photoelectric conversion device has been put to practical use as a representative of the MOS type photoelectric conversion devices. FIG. 14 is a general circuit configuration diagram of a pixel carrying a CMOS sensor. In FIG. 14, a reference numeral 1 designates a photodiode. A reference numeral 2 designates a transfer MOS transistor for transferring signal charges generated by the photodiode 1. A reference numeral 3 designates a floating diffusion region (hereinafter referred to as "floating diffusion") for storing the transferred signal charges temporarily. A reference numeral 4 designates a resetting MOS transistor for resetting the floating diffusion 3 and the photodiode 1. A reference numeral 5 designates a selection MOS transistor for selecting an arbitrary row in an array. A reference numeral 6 designates a source follower MOS transistor for converting the signal charges of the floating diffusion 3 to a voltage to amplify the converted voltage by a source follower type amplifier. A reference numeral 7 designates a sense line, which is commonly used for one column to read pixel voltage signals. A reference numeral 8 designates a constant current source for flowing a constant current on the sense line 7.

It is needless to say that the present pixel circuit configuration can be applied to the present invention.

Figure 15:
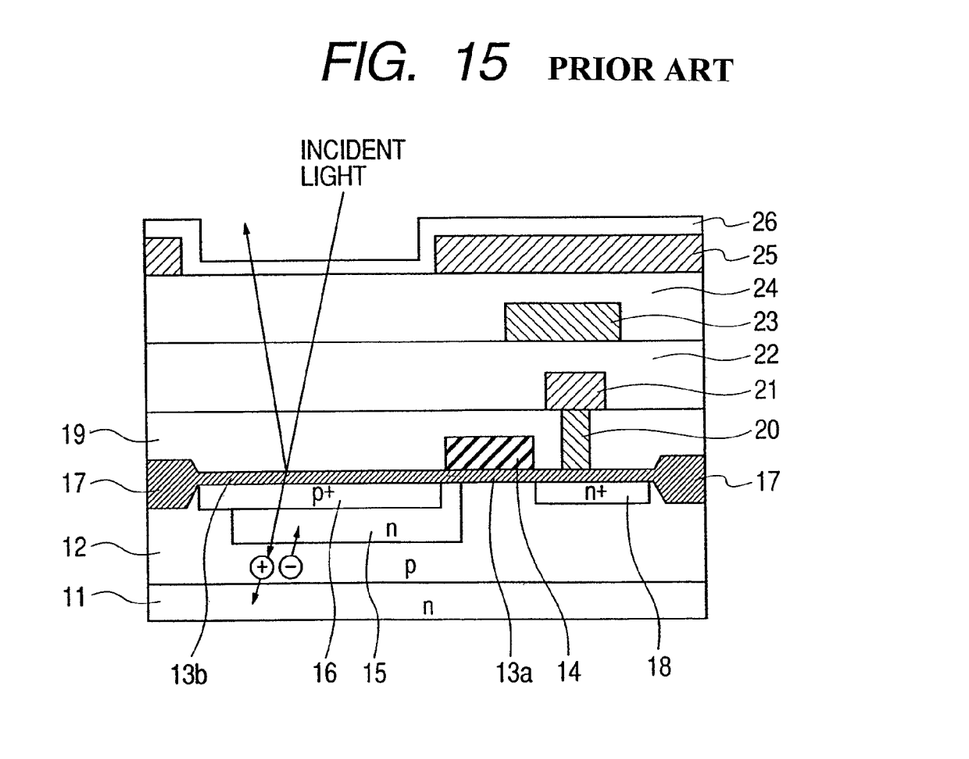
FIG. 15 is a schematic sectional view of a pixel carrying a conventional CMOS sensor.

FIG. 15 is a schematic sectional view of a pixel carrying the conventional CMOS sensor. FIG. 15 especially shows a part composed of the photodiode 1 and the transfer MOS transistor 2 in FIG. 14. A reference numeral 11 designates an n type silicon substrate. A reference numeral 12 designates a P type well. A reference numeral 13a designates a gate oxide film of the MOS transistor 2. A reference numeral 13b designates a thin oxide film on a light receiving portion. A reference numeral 14 designates a gate electrode of the transfer MOS transistor 2. A reference numeral 15 designates an N type cathode of the photodiode 1. A reference numeral 16 designates a surface P type region for designing the photodiode 1 to have a buried structure. A reference numeral 17 designates a selection oxide film for isolating elements. A reference numeral 18 designates an N type high concentration region, which forms the floating diffusion 3 and is also the drain region of the transfer MOS transistor 2. A reference numeral 19 designates a silicon oxide film for insulating the gate electrode 14 from a metal first layer 21. A reference numeral 20 designates a contact plug. The reference numeral 21 designates the metal first layer. A reference numeral 22 designates an interlayer insulation film for insulating the metal first layer 21 from a metal second layer 23. The reference numeral 23 designates the metal second layer. A reference numeral 24 designates an interlayer insulation film for insulating the metal second layer 23 from a metal third layer 25. The reference numeral 25 designates the metal third layer. A reference numeral 26 designates a passivation film. In a color photoelectric conversion device, a not shown color filter layer, and further a not shown microlens for improving sensitivity are formed as upper layers of the passivation film 26. The light which has entered from the surface passes through an opening portion where the metal third layer 25 is not formed, and enters the photodiode. The light is absorbed in the N type cathode 15 or the P type well 12 to generate electron-hole pairs. Among them, the electrons are accumulated in the N type cathode 15.

Moreover, Japanese Patent Application Laid-Open No. 2000-12822 discloses a solid state image pickup device including a plurality of pixels formed in a semiconductor substrate. The pixels severally include a light receiving portion and a diffusion region, to which signal charges are transferred from the light receiving portion. In the solid state image pickup device, a reflection prevention film is formed above the semiconductor substrate with an insulation film interposed between the reflection prevention film and the semiconductor substrate in the light receiving portion. The reflection prevention film is formed so as to avoid at least a part above the diffusion region.

However, a part of the incident light does not enter the photodiode owing to the optical reflection on the interface between the surface P type region 16 and the thin oxide film 13b on the photodiode. The loss of the reflection can be expressed by the following formula.

$$(Nsi(\lambda) - Nsio2(\lambda))^2 / (Nsi(\lambda) + Nsio2(\lambda))^2 \qquad (1)$$

where $Nsi(\lambda)$ designates the refraction index of silicon at the wavelength $\lambda$; $Nsio2(\lambda)$ designates the refraction index of a silicon oxide film at the wavelength $\lambda$.

As apparent from the formula (1), the larger the difference of refraction indices of adjoining two films is, the larger the ratio of reflection is. In the cross section structure shown in FIG. 15, all of the interlayer insulation films 19, 22, 24 and 26 are silicon oxide films. A flattened resin having a refraction index close to the refraction indices of the silicon oxide films is formed on the passivation film 26. Consequently, the maximum loss is generated on the interface between silicon ($Nsi=4$ to 5) and a silicon oxide film ($Nsic2=1.4$ to 1.5). In a CMOS type photoelectric conversion device, the surface of silicon of a photodiode adjoins a silicon oxide film, and consequently the lowering of the sensitivity of the photodiode has been produced.

Next, the reasons why noises are large will be described.

Figure 16:
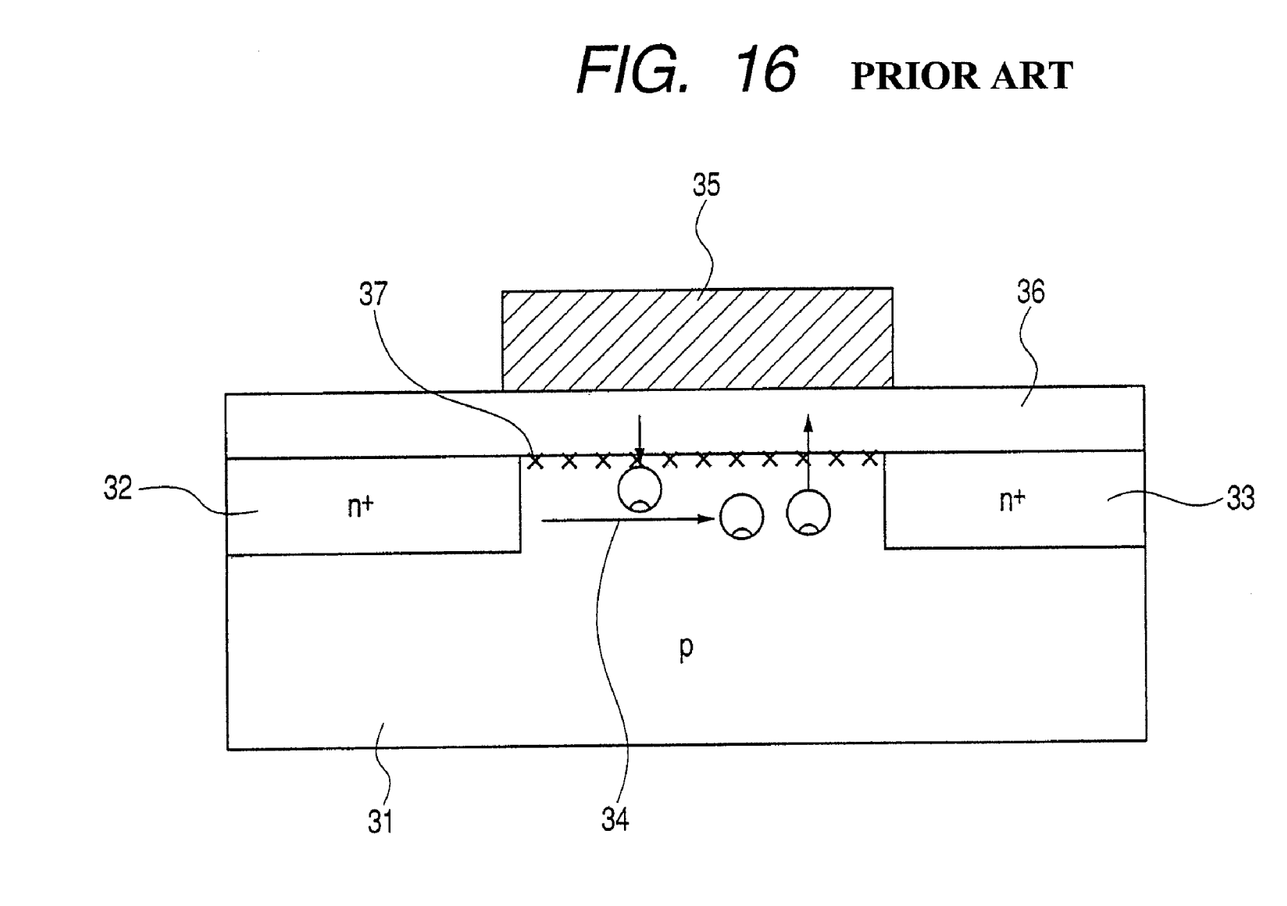
FIG. 16 is a view for illustrating 1/f noises of a MOS transistor.

There are fixed pattern noises and random noises in the noise components to be generated in a CMOS type sensor. Hereupon, the random noises are noticed among them. Because the noise components to be generated in the source follower MOS transistor 6 among the random noise components have outputs in proportion to the 1/f of a drive frequency f of the MOS transistor 6, the noise components are called as 1/f noises. It is said that the 1/f noises are generated because carriers are randomly charged and discharged at a trap level of the interface between silicon and a silicon oxide film of a MOS transistor (see FIG. 16). FIG. 16 is a sectional view of a MOS transistor for illustrating the 1/f noises. FIG. 16 exemplifies an NMOS transistor. The NMOS transistor includes a gate electrode 35 above a P type substrate 31 with a gate oxide film 36 between, and an N+ type source 32 and a drain 33, both formed on the surface of the transistor. Because channel electrons 34 to flow by the application of a voltage between the gate electrode 35 and the drain 33 are influenced by the charging and the discharging of charges at a trap 37 of the gate oxide film 36, drain currents randomly fluctuate at every operation. The fluctuation is the cause of the 1/f noises. Moreover, because the largeness of the noises is in inverse proportion to the size of the MOS transistor, the finer a pixel is, the larger the noises are. Because the other random noises and fixed pattern noises have been lowered by the improvement of design such as contrivances of a circuit and a device, the 1/f noises has occupied a large portion in the whole random noise components.

SUMMARY OF THE INVENTION

As a method for achieving the above-mentioned object, the present invention is a photoelectric conversion device including pixels arranged in an array, each of the pixels comprising:

a light receiving region for converting light to signal charges;

an insulation film formed on a surface of the light receiving region; and transistors including an amplifying transistor for amplifying the signal charges to output the amplified signal charges, wherein a reflection prevention film having a refractive index higher than that of the insulation film is arranged above the light receiving region with the insulation film interposed between the reflection prevention film and the light receiving region, and film thicknesses of the insulation film and gate insulation films of the transistors are different from each other.

Moreover, a method for manufacturing a photoelectric conversion device including pixels arranged in an array, each of the pixels including: a light receiving region for converting light to signal charges; an insulation film formed on a surface of the light receiving region; and transistors including an amplifying transistor for amplifying the signal charges to output the amplified signal charges, the method comprising the steps of:

arranging a reflection prevention film having a refractive index higher than that of the insulation film above the light receiving region with the insulation film interposed between the reflection prevention film and the light receiving region, and oxidizing the insulation film again after forming gate electrodes of said transistors.

Moreover, a method for manufacturing a photoelectric conversion device including pixels arranged in an array, each of the pixels including: a light receiving region for converting light to signal charges; an insulation film formed on a surface of the light receiving region; and transistors including an amplifying transistor for amplifying the signal charges to output the amplified signal charges, the method comprising the steps of:

arranging a reflection prevention film having a refractive index higher than that of the insulation film above the light receiving region with the insulation film interposed between the reflection prevention film and the light receiving region;

removing the insulation film once after forming gate electrodes of the transistors; and performing re-oxidization.

The operation of a first claim is as follows.

The surface of a photodiode is configured to be a silicon oxide film/a silicon nitride film/a silicon oxide film. Thereby, by means of the multiple interference phenomenon of a thin film, the reflection in a visible light region is suppressed, and the film thicknesses of an insulation film between a silicon substrate and a high refraction index film and a gate insulation film of a transistor are severally optimized. Thereby, a reflection prevention effect and the properties of the transistor are reconciled.

In a second claim, a high dielectric constant film is removed above at least a source follower MOS transistor. Thereby, hydrogen molecules to be diffused from a surface at the time of performing a hydrogen termination process in a later manufacturing process are not intercepted by the high dielectric constant film, and a trap of a gate oxide film of the transistor can be terminated. Consequently, the effect of the improvement of sensitivity by the reflection prevention and the effect of the reduction of 1/f noises by the termination of hydrogen can be more effectively reconciled.

In a third claim, the high dielectric constant film is made of a silicon nitride film formed by a thermochemical vapor deposition method, which can be generally available at in a high temperature process (>600° C.) of silicon. Thereby, a thin film which has brought results in material properties, process properties and reliability can be used for reflection prevention. Moreover, the insulation film above the silicon substrate is made of a silicon oxide film. Thereby, by adding an oxidization process after the formation of a gate electrode of the transistor, a film thickness of the insulation film can be selected so as to reconcile the reflection prevention effect and the properties of the transistor.

In a fourth claim, a silicon oxide film is formed on a side wall of a polysilicon gate electrode. Thereby, it is prevented for the silicon nitride film of the reflection prevention film from touching the gate electrode directly, and the stabilization of the properties of the transistor and the reflection prevention effect can be reconciled.

In a fifth claim, by isolating the high dielectric constant film at every pixel, the reflection prevention effect can be obtained while the stress of the high dielectric constant film, which frequently works as a large tensile stress to silicon, is relaxed.

In a sixth claim, the high dielectric constant film is formed to be a silicon nitride film by a hydrogen-rich plasma chemical vapor deposition method. Thereby, a trap at an interface of the transistor or a trap at the interface of silicon/a silicon oxide film on the photodiode can be more effectively decreased.

In a seventh claim, the trap at the interface of silicon/a silicon oxide film is terminated by hydrogen. Consequently, the hydrogen in the silicon nitride film formed by the plasma chemical vapor deposition can be effectively dissociated by a heat process.

The operation of an eighth claim is the same as that of the third claim.

In a ninth claim, it becomes possible to reduce the difference between the refractive indices of the reflection film and the interlayer insulation film. Consequently, further reduction of the reflection ratio can be achieved.

Hence, because the incident light into the sensor can be converted to charges more efficiently than the prior art by the present invention, the sensitivity of the sensor is improved.

Moreover, by using a hydrogen-rich film as the reflection prevention film, the trap level of the source follower MOS transistor, which has been primary factor of the random noises in the sensor, can be lowered. Consequently, the noises of the sensor can be also reduced.

Moreover, by adding oxidization process after the formation of the polysilicon gate electrode, the thickness of a silicon oxide film can be selected so as to reconcile the reflection prevention conditions and the properties of the transistor. Moreover, in the case where the silicon nitride film for reflection prevention is commonly used for a side spacer, the silicon nitride film works as a stress relaxing layer.

Furthermore, by adopting a configuration in which two or more layers of reflection prevention films are laminated above at least a part of the photoelectric conversion portion with an insulation film between, the difference between the refractive indices of the reflection prevention film and the interlayer insulation film becomes small. Consequently, the reflection at the interface can be sufficiently suppressed, and then a photoelectric conversion device having further higher sensitivity can be provided. Moreover, by forming the thicknesses of the first reflection prevention film and the second reflection prevention film suitably, it becomes possible to lowering the loss of incident light by means of the optical interference operation of these films, and thereby the further improvement of the sensitivity of a photoelectric conversion device can be achieved.

DESCRIPTION OF THE PREFERRED EMBODIMENTS

In the following, the preferred embodiments of the present invention will be described in detail by the use of the attached drawings.

First Embodiment

Figure 1:
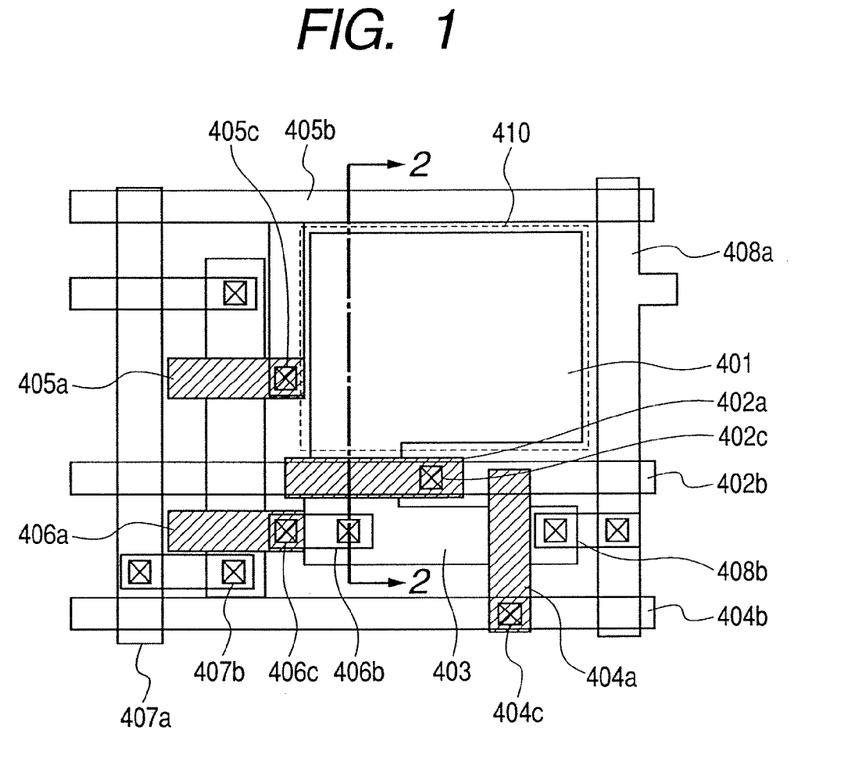
FIG. 1 is a plan view of a pixel of a CMOS sensor of a first embodiment of the present invention.

FIG. 1 is a schematic view showing the configuration of a pixel of a photoelectric conversion device of a first embodiment of the present invention. In FIG. 1, a reference numeral 401 designates a photodiode, which is a light receiving region for generating and storing charges according to incident light. A reference numeral 402a is a gate electrode of a transfer MOS transistor for transferring generated signal charges to floating diffusion. As the gate electrode 402a, for example, polysilicon is used. A reference numeral 402b designates a transfer line made of a metal for connecting a transfer electrode in an array. A reference numeral 402c designates a contact portion connecting the transfer gate 402a to a transfer line 402b. A reference numeral 403 designates a floating diffusion region (hereinafter referred to as "floating diffusion") for storing the transferred charges temporarily. A reference numeral 404a designates a gate of a reset MOS transistor for resetting the floating diffusion or the photodiode 401 before the storing of charges. A reference numeral 404b designates a reset line for connecting the reset MOS transfer gate 402a in an array. A reference numeral 404c designates a contact portion for connecting the gate 402a of the reset MOS transistor to the reset line 402b. A reference numeral 405a designates the gate of a selection MOS transistor for selecting a pixel to be read. A reference numeral 405b designates a selection line for connecting selection MOS transistors to each other. A reference numeral 405c designates a contact portion for connecting the gate 405a of the selection MOS transistor to the selection line 405b. A reference numeral 406a designates the gate of a source follower MOS transistor for detecting and amplifying the potential at the floating diffusion 403. A reference numeral 406b designates metal wiring for connecting the gate 406a of the source follower MOS transistor to the floating diffusion 403. A reference numeral 406c designates a contact portion for connecting the metal wiring 406b to the gate 406a of the source follower MOS transistor. A reference numeral 407a designates a sense line for taking out the signals read by the source follower MOS transistor to the outside of the pixel region. A reference numeral 407b designates a contact portion for connecting the sense line 407a to the source of the source follower MOS transistor. A reference numeral 408a designates a VDD power source line to be used for the power source of sense lines and a reset power source. A reference numeral 408b designates a contact portion for connecting the power source line 408a to the drain of the reset MOS transistor.

A region 410 indicated by a broken line to cover the photodiode 410 is a region where a silicon nitride film according the present invention lies as a reflection prevention film. In the present embodiment, as shown in FIG. 1, the silicon nitride film remains only in the photodiode portion needing reflection prevention. Consequently, there is no nitride film on a MOS transistor, and the reflection prevention film is not connected to the reflection prevention films of the adjoining pixels.

The reflection prevention film 410 in the present embodiment uses a silicon nitride film formed by performing the vapor phase growth of a reacted silane gas and an ammonia gas at a temperature in the range of 550° C. to 650° C. in a reduced pressure. The refraction index of the reflection prevention film 410 is 2.0 at the wavelength of 550 nm. Because it is known that hydrogen molecule is difficult to permeate the silicon nitride film 410, hydrogen diffusing from the surface of the device in a hydrogen sintering process is difficult to enter beneath the reflection prevention film. For reducing the trap levels of the four MOS transistors in the pixel, all of the silicon nitride films on the MOS transistor are removed. Thereby, especially the 1/f noises of the source follower MOS transistors are prevented from increasing. Because hydrogen desirably also enters the interface of the photodiode, it is effective to remove a part of the nitride film without covering the whole photodiode as in the present embodiment. In that case, it is preferable to remove the region having low incident light density.

The silicon nitride film 410 formed by the reduced pressure chemical vapor deposition (CVD) method has a large tensile stress to silicon. By the tensile stress of the nitride film, warping of a silicon substrate is generated. In an extreme case, there is a case where wafer chucking in the successive processes is hindered. Also for relaxing such a stress of the silicon nitride film, it is effective to isolate the nitride film between adjoining pixels as in the present embodiment.

Figure 2:
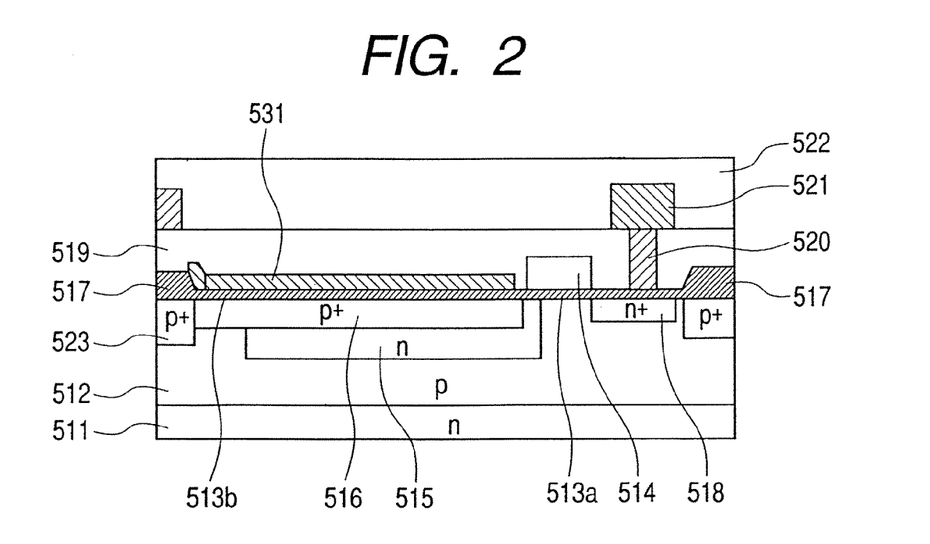
FIG. 2 is a sectional view of the pixel of the CMOS sensor of the first embodiment of the present invention.

FIG. 2 is a schematic sectional view taken along a 2-2 line in FIG. 1.

A reference numeral 511 designates an n type silicon substrate. A reference numeral 512 designates a P type well. A reference numeral 513a designates a gate oxide film of the MOS transistor. A reference numeral 513b designates a thin oxide film on the light receiving portion. A reference numeral 514 designates a gate electrode (corresponding to the gate electrode 402a in FIG. 1) of the transfer MOS transistor. A reference numeral 515 designates an N type cathode of the photodiode 401. A reference numeral 516 designates a surface P type region for designing the photodiode 401 to have a buried structure. A reference numeral 517 designates a mesa type oxide film for isolating elements. Because the element isolation by means of the mesa type oxide film scarcely generates a stress which is generated by the isolation by the local oxidation of silicon (LOCOS) method, the element isolation by the mesa type oxide film has an advantage that a leakage current of the photodiode at the end of the oxide film is small. Consequently, the element isolation by the mesa type oxide film is one suitable for a fine pixel structure. If there is no problem concerning the leakage current, the adoption of the isolation structure by the ordinary LOCOS oxide film is not contradictory to the sprit of the present invention. Moreover, the adoption of the shallow trench isolation (STI) as the element isolation method is not contradictory to the sprit of the present invention. A reference numeral 518 designates an N type high concentration region of the floating diffusion region (floating diffusion). A reference numeral 519 designates a silicon oxide film for insulating the gate electrode 514 from a metal first layer 521. A reference numeral 520 designates a contact plug. The reference numeral 521 designates the metal first layer. A reference numeral 522 designates an interlayer insulation film for insulating the metal first layer 521 from a metal second layer. The structure of the upper portion which does not matter to the sprit of the present invention is omitted. Moreover, a reference numeral 523 designates a channel stop layer under the mesa type oxide film 517. A reference numeral 531 designates a silicon nitride film corresponding to the reflection prevention film 410 in FIG. 1.

Figure 3:
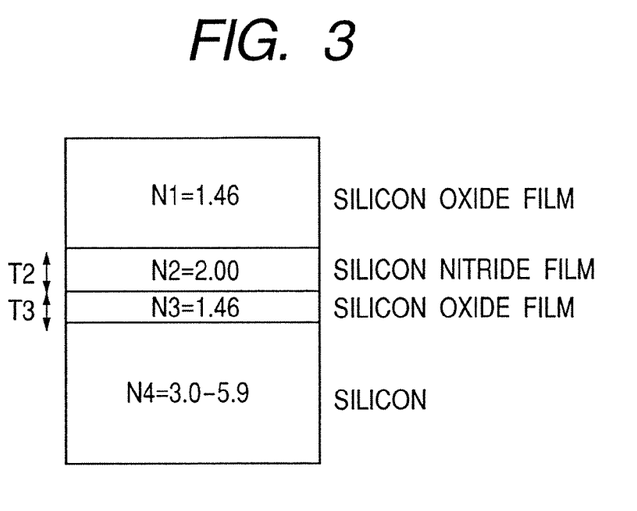
FIG. 3 is a schematic view showing a reflection prevention mechanism of the present invention.

FIG. 3 is a schematic diagram showing the reflection prevention structure of the present invention. As shown in FIG. 3, the silicon nitride film 531 lies between the thin oxide film 513b on the photodiode and the interlayer insulation film 519. The silicon nitride film 531 reduces the rate of the light reflecting by a multiple beam interference effect. Table 1 shows evaluations of reflection ratios at main wavelengths (450 nm, 550 nm and 620 nm) when some of the thicknesses of the silicon nitride film 531 and the silicon oxide film 513b in the structure of the present embodiment. It was ascertained that the reflection ratios, which were large in the case where T2=0 nm, i.e. in case of the conventional structure, decreased at all of the main wavelengths. It can be known that the main wavelengths at which the reflection prevention effect is large change according to the combinations of T2 and T3. Also it is known that all of the combinations are effective in the range of the experiments.

On the basis of the evaluation results, it is known that the ranges of T2=34-40 nm and T3=18-20 nm are suitable for producing the reflection prevention effect in well balance over all of the wavelengths. The effective range of T2 is about 10-60 nm, and the effective range of T3 is about 5-30 nm.

TABLE 1

EVALUATION VALUES OF REFLECTION PREVENTION STRUCTURE OF FIG. 6

| FILM THICKNESSES OF SAMPLES | | REFLECTION RATIO (%) | REFLECTION RATIO (%) | REFLECTION RATIO (%) |
|---|---|---|---|---|
| T2 (nm) | T3 (nm) | @ 450 nm | @ 550 nm | @ 620 nm |
| 0 | 15 | 36 | 25 | 22 |
| 40.5 | 17.8 | 7.5 | 7.5 | 7.8 |
| 50.0 | 9.0 | 10.0 | 6.5 | 7.0 |
| 40.4 | 19.9 | 8.9 | 6.0 | 6.0 |
| 34.5 | 17.8 | 8.0 | 8.2 | 8.5 |
| 50.2 | 17.8 | 11.5 | 5.0 | 4.0 |

Second Embodiment

Figure 4:
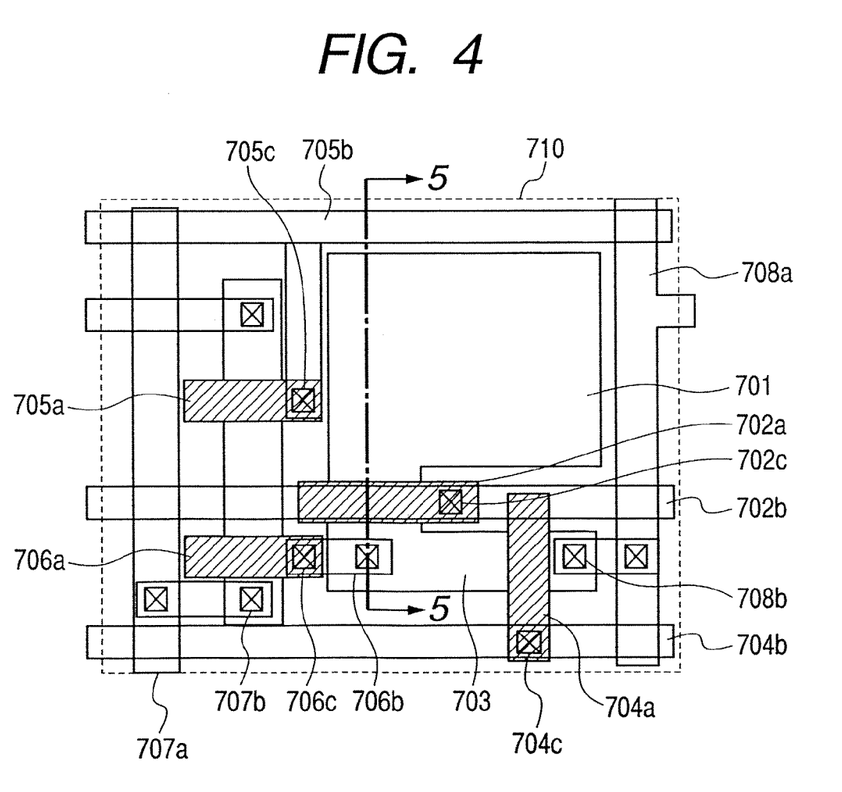
FIG. 4 is a plan view of a pixel of a CMOS sensor of a second embodiment of the present invention.

FIG. 4 is a schematic view showing the configuration of a pixel of a photoelectric conversion device of a second embodiment of the present invention.

The second embodiment differs from the first embodiment in that a film having a high refractive index for reflection prevention also lies in the regions other than a photodiode. A region 710 enclosed by a broken line is a region in which a silicon nitride film lies in a pixel. The broken line is for convenience sake, and the silicon nitride film lies to adjoining pixels continuously. Because the other parts are all the same as those in the embodiment 1, their descriptions are omitted.

Figure 5:
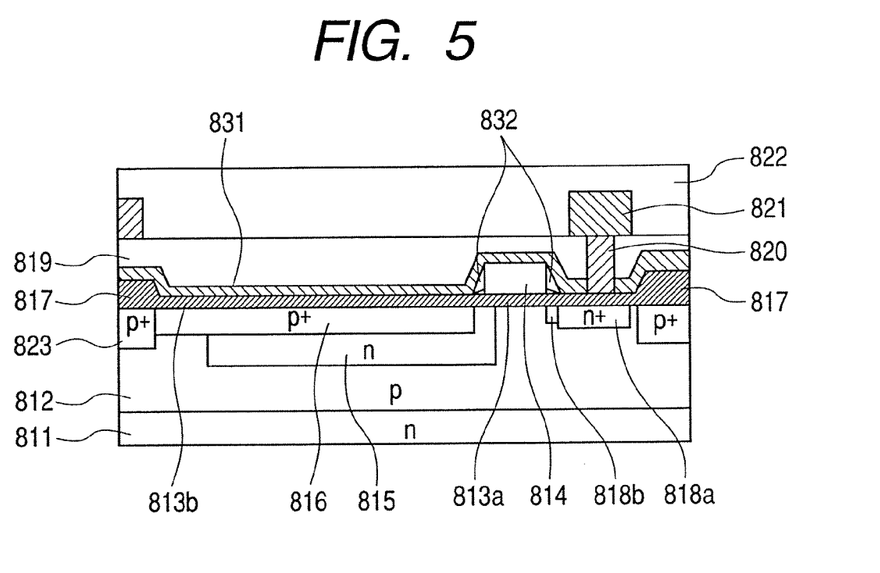
FIG. 5 is a sectional view of the pixel of the CMOS sensor of the second embodiment of the present invention.

FIG. 5 is a schematic sectional view taken along a line 5-5 in FIG. 4. As shown in FIG. 5, a silicon nitride film 831 lies all over the regions. FIG. 5 shows a MOS transistor having a lightly doped drain (LDD) structure. Consequently, an n type drain electric field relaxation layer 818b in a lower density than the density of a drain region 818a of the transfer MOS transistor lies on the channel side of the drain region 818a. The so-called side spacers (side walls) 832 are formed on both the sides of the polysilicon gate electrode 814 for obtaining the LDD structure. The thicknesses of the side spacers 832 in the side surface direction determine the size of the electric field relaxation layer 818b. In the case where the silicon nitride film remains on all over the surface as in the present embodiment, it is necessary to determine the thicknesses of the side spacers 832 in consideration with the thickness of the silicon nitride film 831.

Incidentally, it is needless to say that the present embodiment can be applied to the cases where the LDD structure is not adopted.

Because the sectional view of FIG. 5 shows the same configuration as that of the first embodiment except for the parts described above, the description thereof is omitted.

Incidentally, it is different from the first embodiment that the silicon nitride film used in the present embodiment is formed by the plasma chemical vapor deposition (P-CVD) method. That is, an ammonia gas and a silane gas are mixed in a plasma discharge to deposit a silicon nitride film on a wafer.

The nitride film obtained by the film-formation has a refractive index N=2.0. However, the refractive indices within a range n=1.9-2.1 can be obtained by changing the composition ratio of the gases. The optimum film thickness changes according to refractive indices.

The silicon nitride film formed by the P-CVD method has a small stress to silicon. When the film thickness of the silicon nitride film is 10 nm or less, there is no anxiety that the silicon wafer warps even if the film lies on the whole surface of the wafer. Consequently, there is no need to isolate the film at every pixel.

Moreover, the silicon nitride film formed by the P-CVD method includes several percents of hydrogen. It is well known that the hydrogen diffuses to the outside of the film when the film is heated to 350° C. or higher. A part of the diffused hydrogen molecules reaches the interface between silicon and a silicon oxide film, and embeds in the trap level in the oxide film. As a result, performing heat treatment of the structure of the present embodiment after the film formation of the P-CVD silicon nitride film made, it possible to decrease the 1/f noises of the source follower MOS transistor greatly. Even if the film thickness is 20 nm, a sufficient reduction effect of the 1/f noises can be obtained.

It is of course that, because the same reflection prevention effect as that of the first embodiment can be obtained, the sensitivity of the CMOS sensor is also improved.

As the result, the S/N ratio of the sensor was greatly improved.

Incidentally, the silicon nitride film remains on all over the face in the present embodiment, but the present invention is not limited to such structure. First, from the viewpoint of reducing the 1/f noises, it is important that the trap level of a source follower transistor is decreased. Consequently, if the silicon nitride film lies right above or in the vicinity of the gate 706a of the MOS transistor in the plan view of FIG. 4, then a sufficient effect can be obtained. Moreover, from the viewpoint of manufacturing, if the nitride film lies all over the surface, etching should be performed at two steps or three steps to make the process complicated and to lower the accuracy of working sizes when a contact hole is opened in an interlayer insulation film 819. Consequently, to remove the silicon nitride film at the contact position in advance is effective.

As described above, various possibilities exist in the remaining positions of the silicon nitride film, and all of the possibilities are not excluded from the present invention.

Third Embodiment

Figure 6:
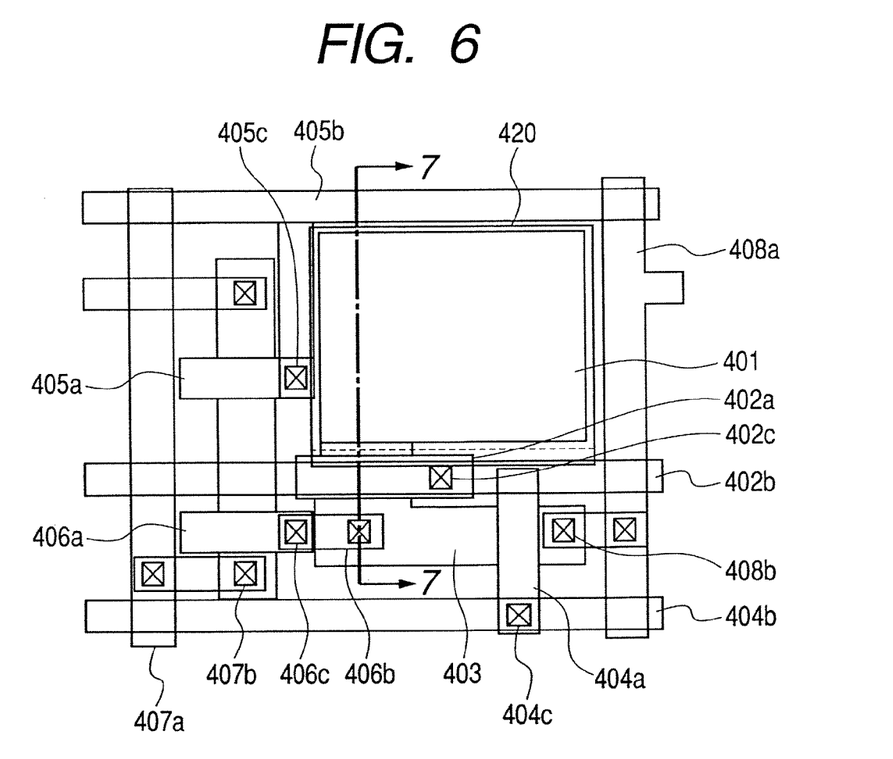
FIG. 6 is a plan view of a pixel of a CMOS sensor of a third embodiment of the present invention.

FIG. 6 is a schematic diagram showing the configuration of a pixel of an photoelectric conversion device of a third embodiment of the present invention.

Figure 7:
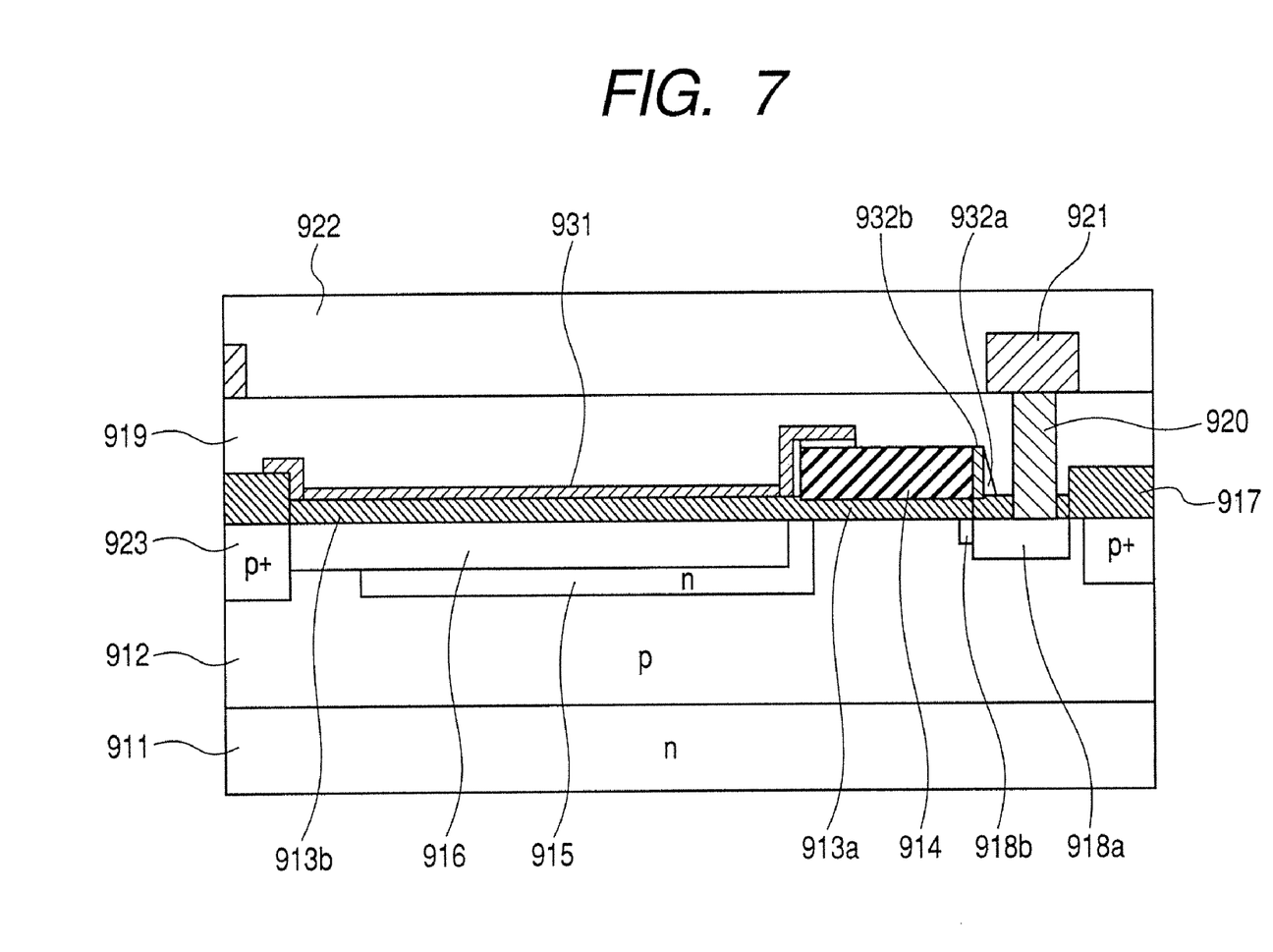
FIG. 7 is a sectional view of the pixel of the CMOS sensor of the third embodiment of the present invention.

FIG. 7 is a schematic sectional view taken along a line 7-7 in FIG. 6. The present embodiment differs from the first and the second embodiments in that the thickness of a silicon oxide film between a silicon nitride film, which is a high refractive film for reflection prevention, and a silicon substrate, and the thickness of a gate oxide film are severally optimized. For that sake, after the formation of a polysilicon gate electrode, an oxidation process is performed.

A reference numeral 913a designates a gate oxide film of a MOS transistor. A reference numeral 914 designates a polysilicon electrode. A reference numeral 913b designates a silicon oxide film on a photodiode. FIG. 7 shows the state in which film thicknesses are adjusted by performing oxidation after the formation of the polysilicon gate electrode 914. A reference numeral 931 designates a silicon nitride film for reflection prevention. A reference numeral 932b designates a silicon oxide film grown on a side wall of the polysilicon gate electrode 914 of the MOS transistor. A reference numeral 932a designates a side spacer of the silicon nitride film 931.

The region enclosed by a wide line 420 in FIG. 6 is the region where the silicon nitride film 931 lies as a reflection prevention film in the present embodiment. Because the structure of the pixel in FIG. 6 other than the parts described above is the same as that of the first embodiment, the descriptions of the structure are omitted. Incidentally, the region where the silicon nitride film 931 lies covers the whole region of the photodiode in FIG. 6, but, if the silicon nitride film is partially removed from the photodiode region, the remained state is not contradictory to the sprit of the present invention.

As shown in table 1, for increasing the effect of the reflection prevention, it is necessary to optimize the thicknesses of the silicon oxide film and the silicon nitride film. The silicon oxide film can be commonly used as the gate oxide film. However, from the requirement of the properties of the MOS transistor, the thickness of the silicon oxide film sometimes differs from the optimum film thickness for the reflection prevention.

Moreover, as shown in FIG. 7, the silicon nitride film for reflection prevention can be commonly used with the side spacer of the LDD structure. In that case, if the polysilicon gate electrode is touched to the silicon nitride film, the characteristics of the MOS transistor are sometimes influenced by the stress of the silicon nitride film. Accordingly, the stress can be relaxed by oxidizing the polysilicon gate electrode, and by putting the silicon oxide film between the polysilicon gate electrode and the silicon nitride film.

In the photoelectric conversion device of the present embodiment, the following thicknesses could be effectively adoptable. That is, the thickness of the silicon oxide film on the photodiode was within the range of 16-30 nm. The thickness of the silicon nitride film was within the range of 25-50 nm. The thickness of the gate oxide film was within the range of 7-16 nm. The thickness of the silicon oxide film on the side wall of the polysilicon electrode was within the range of 10-50 nm. Incidentally, the values required to the thicknesses of the gate oxide film and the side wall oxide film from the properties of the photoelectric conversion device are not determined uniquely. Consequently, even if thicknesses exceeding the respective thicknesses of the present embodiment, the thicknesses are not in contradictory to the sprit of the present invention.

Moreover, with respect to the manufacturing method of the present embodiment, additional oxidization may be preformed after the formation of the polysilicon electrode, or re-oxidization may be performed so as to form a desired film thickness after removing the silicon oxide film on the photodiode once. Moreover, the film seeds of the gate insulation film on the MOS transistor and the insulation film on the photodiode may be different from each other.

Fourth Embodiment

Figure 8:
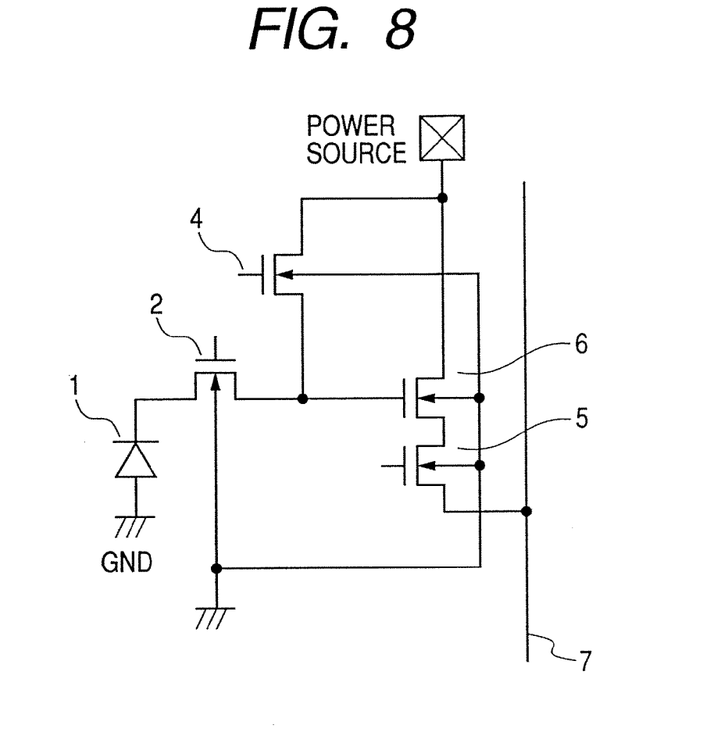
FIG. 8 is a circuit diagram of an equivalent circuit of a pixel of a CMOS sensor of a fourth embodiment of the present invention.
Figure 9:
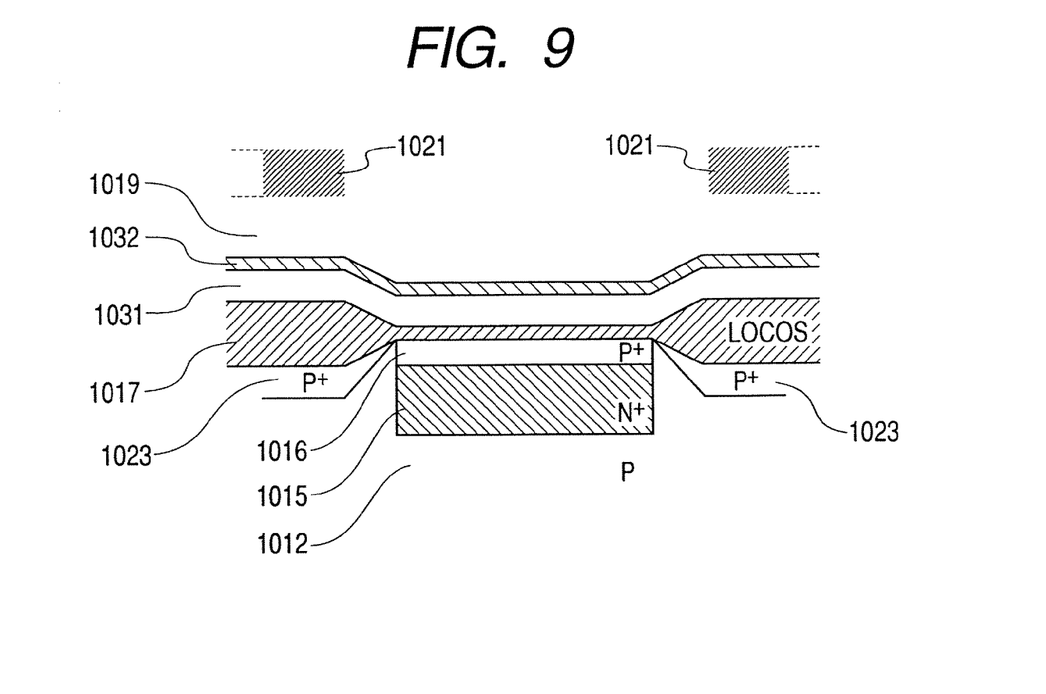
FIG. 9 is a sectional view of the pixel of the CMOS sensor of the fourth embodiment of the present invention.

FIG. 8 is a circuit diagram of an equivalent circuit of a unit pixel in a photoelectric conversions device of a fourth embodiment of the present invention. FIG. 9 is a schematic sectional view showing a region related to a reflection prevention film in the unit pixel of the photoelectric conversion device shown by the circuit diagram of the equivalent circuit of FIG. 8.

In FIG. 8, a photoelectric conversion portion 1 is connected to the gate of a source follower input MOS transistor 6 through a transfer MOS transistor 2. The source of the source follower input MOS transistor 6 is connected to a vertical signal line 7 through a selection MOS transistor 5. Moreover, a reset MOS transistor 4 for resetting the gate of the source follower input MOS transistor 6 to a predetermined potential is provided. Moreover, generally, ground (GND) wiring (not shown in FIG. 8) to be connected to the GND at every pixel is provided for suppressing the transient fluctuations of the GND potential at the time of driving.

The present embodiment further reduces the difference of refraction indices between a reflection prevention film and an interlayer insulation film to achieve the further reduction of a reflection ratio. The present embodiment is a photoelectric conversion device in which a plurality of pixels including photoelectric conversion portions is provided, and the embodiment is characterized in that two or more reflection prevention films are laminated above at least a part of the photoelectric conversion portions with an insulation film between. In particular, the present embodiment is characterized in that the refractive index of a second reflection prevention film is larger than the refractive index of the interlayer insulation film, and that the refractive index of a first reflection prevention film is larger than the second reflection prevention film. The present embodiment aims to suppress interface reflection by decreasing the difference between the refractive indices of the reflection prevention film and the interlayer insulation film.

Figure 10:
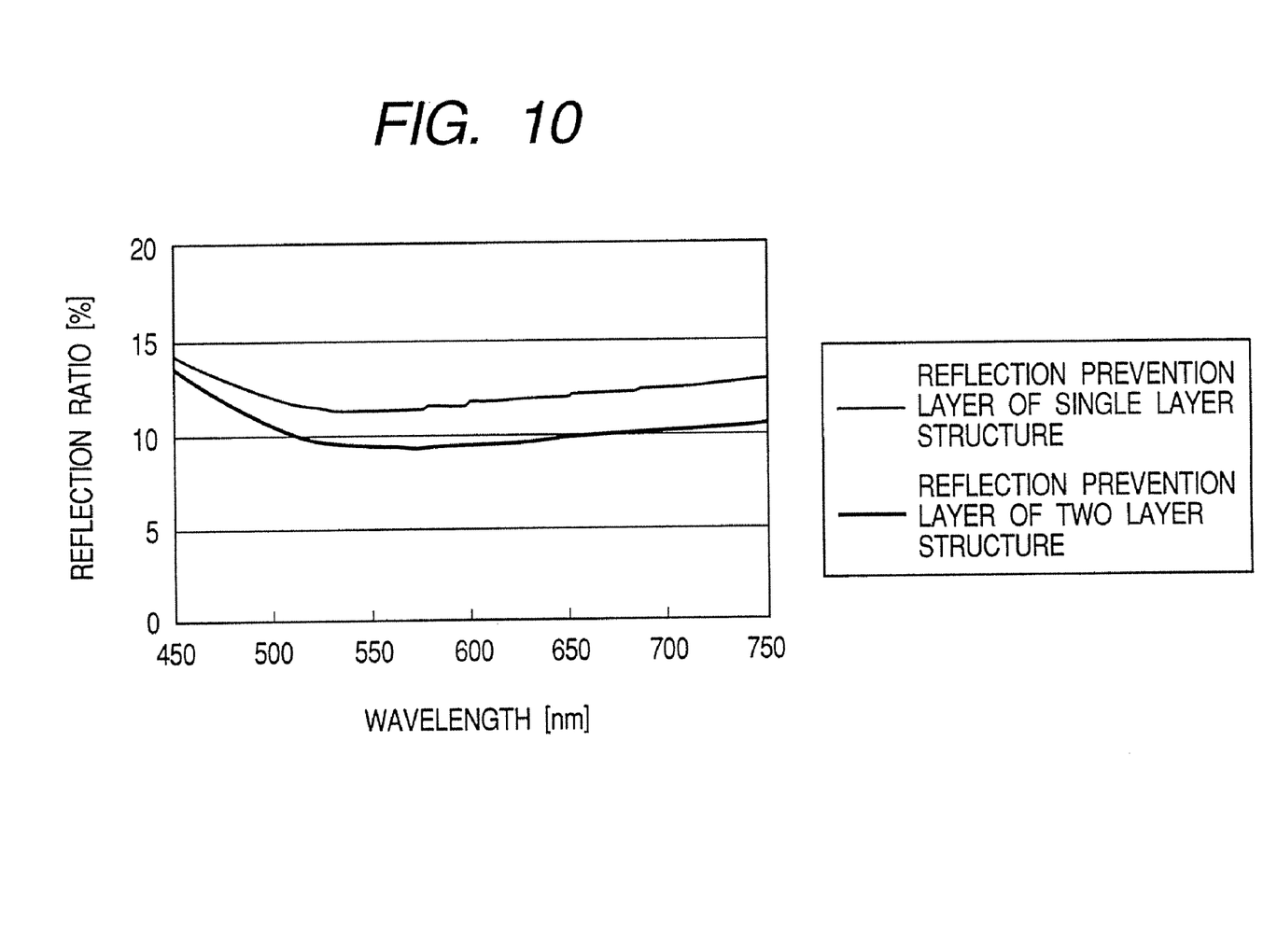
FIG. 10 is a graph showing an effect of the fourth embodiment of the present invention.

In FIG. 9, a reflection prevention film 1031 made of a silicon nitride is formed on silicon with a silicon oxide between. On the reflection prevention film 1031, a second reflection prevention film 1032 made of a silicon oxide nitride is formed. On the reflection prevention film 1032, an interlayer insulation film 1019 made of a silicon oxide is formed. The refractive index of the silicon nitride is about 2.0. The refractive index of the silicon oxide nitride is about 1.7. The refractive index of the silicon oxide is about 1.46. Moreover, the film thicknesses of the silicon nitride and the silicon oxide nitride are preferably within a range of 20-80 nm and a range of 5-30 nm, respectively. In particular, respective ranges are most preferably about 40 nm and 20 nm, respectively. As shown in FIG. 10, the reflection ratio of the photoelectric conversion device of two layer structure of the reflection prevention films is reduced in comparison with the reflection ratio of the photoelectric conversion device of the one layer structure of the reflection prevention film. The sensitivity of the photoelectric conversion device of the present embodiment is improved in almost all regions of the visible light.

Figure 11:
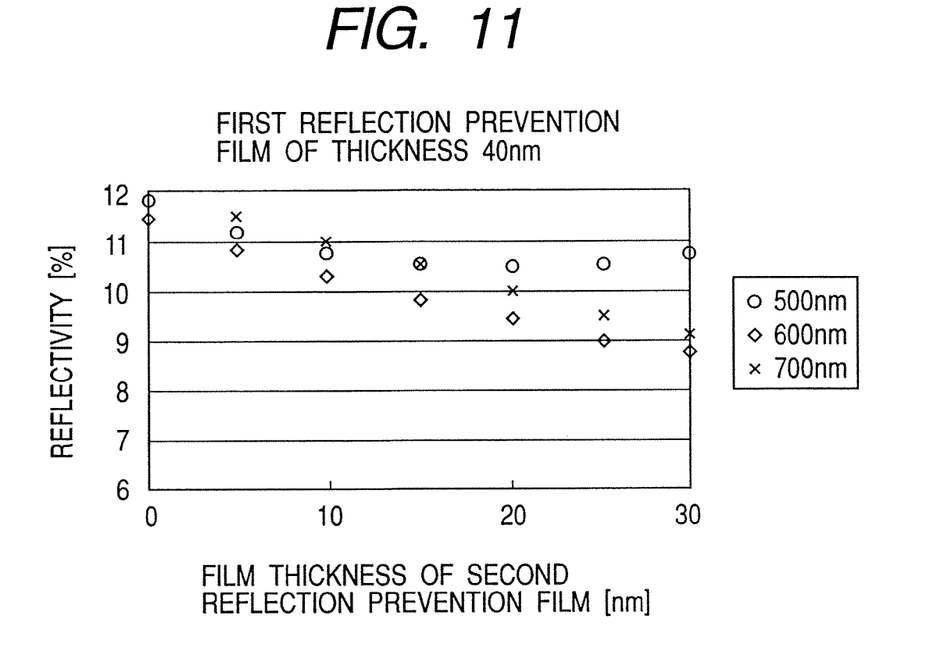
FIG. 11 is a graph showing the reflectivity of each wavelength to the film thicknesses of a second reflection prevention film of the fourth embodiment of the present invention.

Moreover, relations between the film thickness of a reflection prevention film and the refractive index thereof will be described in detail. For example, in the case where the film thickness of the silicon oxide right above the photoelectric conversion portion is made to be about 8 nm and the film thickness of the first reflection film made of the silicon nitride with a silicon oxide on the silicon between is made to be 40 nm, the refractive indices of each wavelength to the film thicknesses of the second reflection prevention film made of the silicon oxide nitride formed right above the first reflection prevention film are values shown in FIG. 11. That is, by setting the film thickness of the second reflection prevention film to be about 20 nm or less, it becomes possible to decrease the reflection ratio in the whole region of the visible light. Moreover, if the film thickness of the second reflection film is about 20 nm or more, the reflection ratio in the long visible light wave length region of the wave length about 600 nm or 700 nm is further lowered. However, because the reflection ratio in the short visible light wave length region of the wave length about 500 nm or less passes through a peak of the minimum reflection ratio to have a tendency of increasing the reflection ratio, it is most preferable to set the film thickness to be 20 nm or less. However, if the film thickness is 30 nm or less, it is possible to determine the film thickness by treating the sensitivity allocation as a designing matter.

Figure 12:
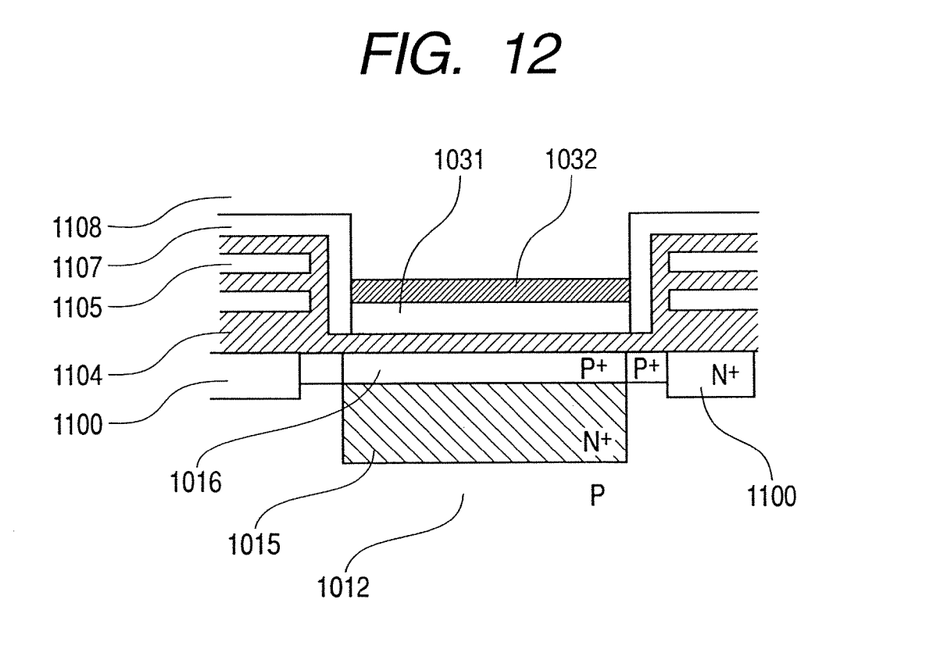
FIG. 12 is a schematic sectional view showing a variation of the fourth embodiment of the present invention.

Moreover, the present embodiment can be also applied to a CCD solid state image pickup device. FIG. 12 is a schematic sectional view showing the region related to a reflection prevention film in the sectional structure of a unit pixel of a CCD solid state image pickup device. Also in the present structure, the effect of improving the sensitivity can be obtained like the CMOS sensor.

Fifth Embodiment

Figure 13:
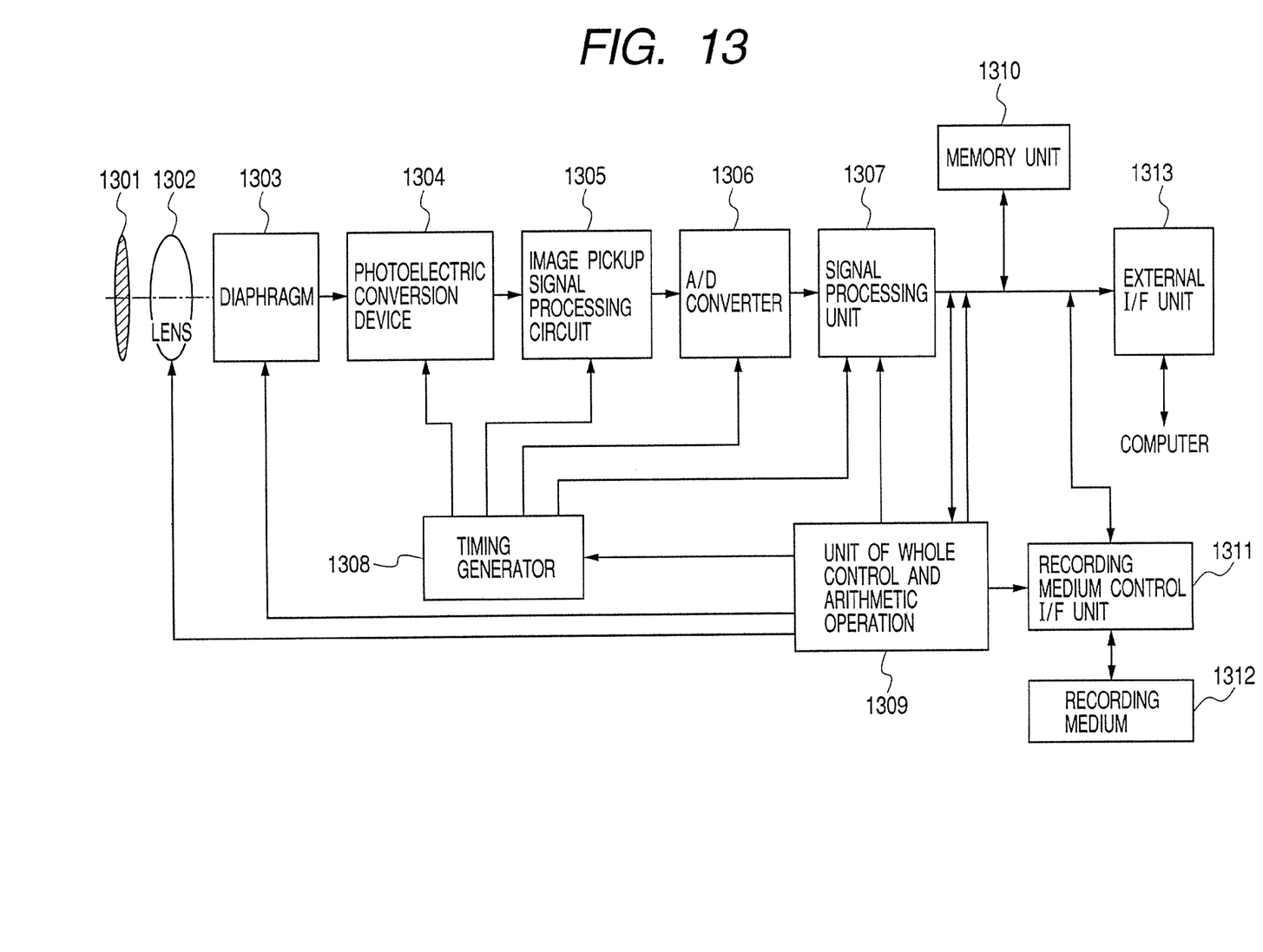
FIG. 13 is a block diagram of a camera system using a photoelectric conversion device according to the present invention.

FIG. 13 shows an example of a circuit block in the case where the photoelectric conversion device of the present invention is applied to a camera. A shutter 1301 is located before a taking lens 1302. The shutter 1301 controls exposure. A light quantity is controlled by a diaphragm 1303 as the need arises. The taking lens 1302 forms an image on a photoelectric conversion device 1304. A signal output from the photoelectric conversion device 1304 is processed by an image pickup signal processing circuit 1305. The processed signal is converted from an analog signal to a digital signal by an analog to digital (A/D) converter 1306. The output digital signal is further arithmetically processed by a signal processing unit 1307. The processed digital signal is stored in a memory 1310, or is transmitted to external equipment through an external interface (I/F) 1313. The photoelectric conversion device 1304, the image pickup signal processing circuit 1305, the A/D converter 1306 and the signal processing unit 1307 are controlled by timing generator 1308. Besides, the whole system is controlled by a unit of whole control and arithmetic operation 1309. For recording images in a recording medium 1312, an output digital signal is recorded through a recording medium control I/F unit 1311, which is in turn controlled by the unit of whole control and arithmetic operation 1309.

The present invention relates to a photoelectric conversion device in which a reflection prevention film having a refractive index higher than that of an insulation film is arranged above a light receiving region with the insulation film between, and to a method for manufacturing the photoelectric conversion device. In particular, the present invention is suitably used for an amplification type MOS solid state image pickup device.

The photoelectric conversion device and the method for manufacturing the photoelectric conversion device according to the present invention are suitably used in digital imaging equipment such as a digital still camera, a digital video camera, an image scanner and a portable telephone equipped with a digital still camera.

What is claimed is:

1. A photoelectric conversion device comprising:
   a light receiving region for converting light to signal charges;
   transistors;
   an element isolation region;
   an insulation film arranged on a surface of the light receiving region, under gate electrodes of the transistors and over the element isolation region;
   a first reflection prevention film, having a refractive index higher than that of the insulation film, wherein the first reflection prevention film:
      is arranged at least above the light receiving region to sandwich the insulation film between the first reflection prevention film and the light receiving region,
      is arranged over at least a part of the element isolation region, and
      includes a silicon nitride film;
   an interlayer insulation film arranged on the first reflection prevention film; and
   a second reflection prevention film laminated between the first reflection prevention film and the interlayer insulation film, and arranged over at least a part of the element isolation region.

2. A photoelectric conversion device according to claim 1, wherein
   the transistors include a transfer transistor for transferring signal charges from the light receiving region,
   the first reflection prevention film is arranged on a gate electrode of the transfer transistor, and
   the silicon oxide film is arranged between the first reflection prevention film and the gate electrode of the transfer transistor.

3. A photoelectric conversion device according to claim 1, wherein
   the transistors include an amplifying transistor for amplifying the signal charges and outputting amplified signal charges,
   the first reflection prevention film is arranged on a gate electrode of the amplifying transistor, and
   the silicon oxide film is arranged between the first reflection prevention film and the gate electrode of the amplifying transistor.

4. A photoelectric conversion device according to claim 1, wherein film thicknesses of a first region of the insulation film arranged on a surface of the light receiving region and of a second region of the insulation film arranged under the gate electrodes of the transistors are different from each other.

5. A photoelectric conversion device according to claim 1, wherein the photoelectric conversion device is included in a camera system.

6. The photoelectric conversion device according to claim 1,
   wherein at least one of side walls of the gate electrodes of the transistors includes the silicon nitride film and a silicon oxide film arranged between the silicon nitride film and the gate electrodes, and
   wherein a transistor having a gate electrode with such a side wall includes a source or drain region of LDD structure, and a heavily doped region of the source or drain region of the LDD structure is self aligned to the side wall formed from the silicon nitride film and the silicon oxide film.

7. The photoelectric conversion device according to claim 1, wherein the element isolation region is formed in a shallow trench structure.

8. The photoelectric conversion device according to claim 1, wherein the element isolation region is formed in a mesa structure.

9. A photoelectric conversion device according to claim 1, further comprising a channel stop layer arranged under the element isolation region.

10. The photoelectric conversion device according to claim 1, wherein the element isolation region is formed in a local oxidation structure.

* * * * *